United States Patent
Lee et al.

(10) Patent No.: US 7,615,427 B2
(45) Date of Patent: *Nov. 10, 2009

(54) SPACER-LESS LOW-K DIELECTRIC PROCESSES

(75) Inventors: Yong Meng Lee, Singapore (SG); Young Way Teh, Singapore (SG); Chung Woh Lai, Singapore (SG); Wenhe Lin, Singapore (SG); Khee Yong Lim, Singapore (SG); Wee Leng Tan, Singapore (SG); Hui Peng Koh, Singapore (SG); John Sudijono, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 522 days.

This patent is subject to a terminal disclaimer.

(21) Appl. No.: 11/447,565

(22) Filed: Jun. 5, 2006

(65) Prior Publication Data

US 2007/0281410 A1    Dec. 6, 2007

(51) Int. Cl.
*H01L 21/336* (2006.01)
*H01L 21/8234* (2006.01)

(52) U.S. Cl. ........................ 438/197; 438/199

(58) Field of Classification Search ............... 438/197, 438/199
See application file for complete search history.

(56) References Cited

U.S. PATENT DOCUMENTS

| 6,107,667 | A | 8/2000 | An et al. |
|---|---|---|---|
| 6,613,637 | B1 | 9/2003 | Lee |
| 6,724,051 | B1 | 4/2004 | Woo et al. |
| 6,825,529 | B2 | 11/2004 | Chidambarrao |
| 7,445,978 | B2 * | 11/2008 | Teh et al. ............... 438/199 |
| 2004/0171201 | A1 | 9/2004 | Gambino |
| 2004/0262692 | A1 | 12/2004 | Hareland et al. |

* cited by examiner

*Primary Examiner*—Thien F Tran
(74) *Attorney, Agent, or Firm*—Horizon IP Pte Ltd

(57) ABSTRACT

A first example embodiment provides a method of removing first spacers from gates and incorporating a low-k material into the ILD layer to increase device performance. A second example embodiment comprises replacing the first spacers after silicidation with low-k spacers. This serves to reduce the parasitic capacitances. Also, by implementing the low-k spacers only after silicidation, the embodiments' low-k spacers are not compromised by multiple high dose ion implantations and resist strip steps. The example embodiments can improve device performance, such as the performance of a rim oscillator.

20 Claims, 8 Drawing Sheets

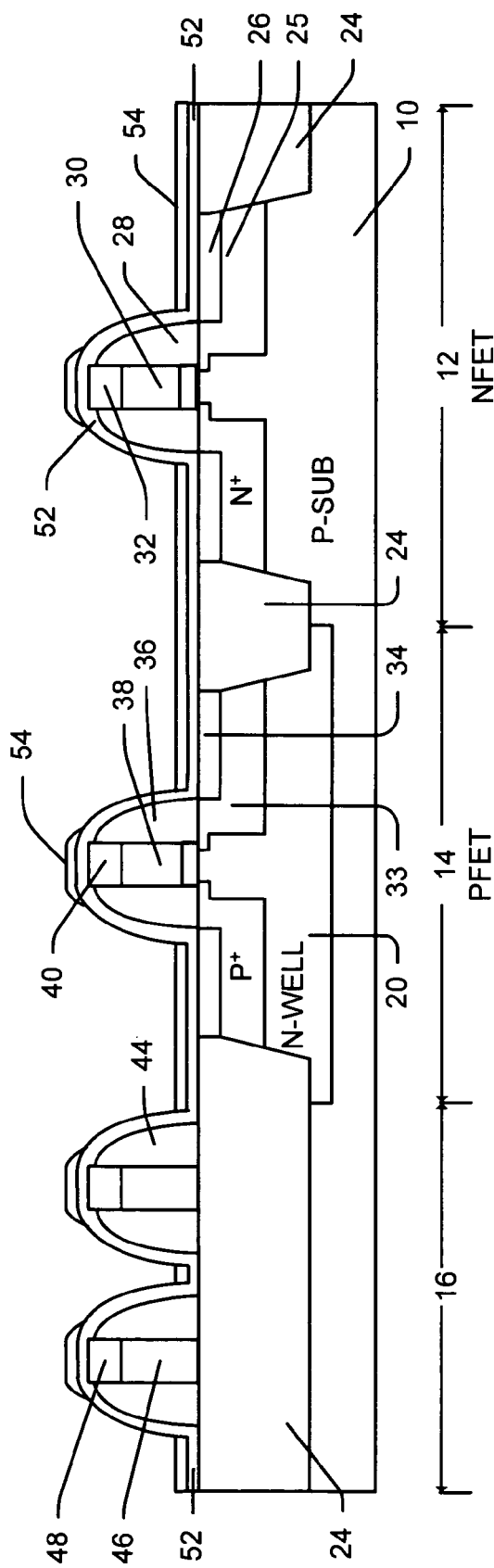
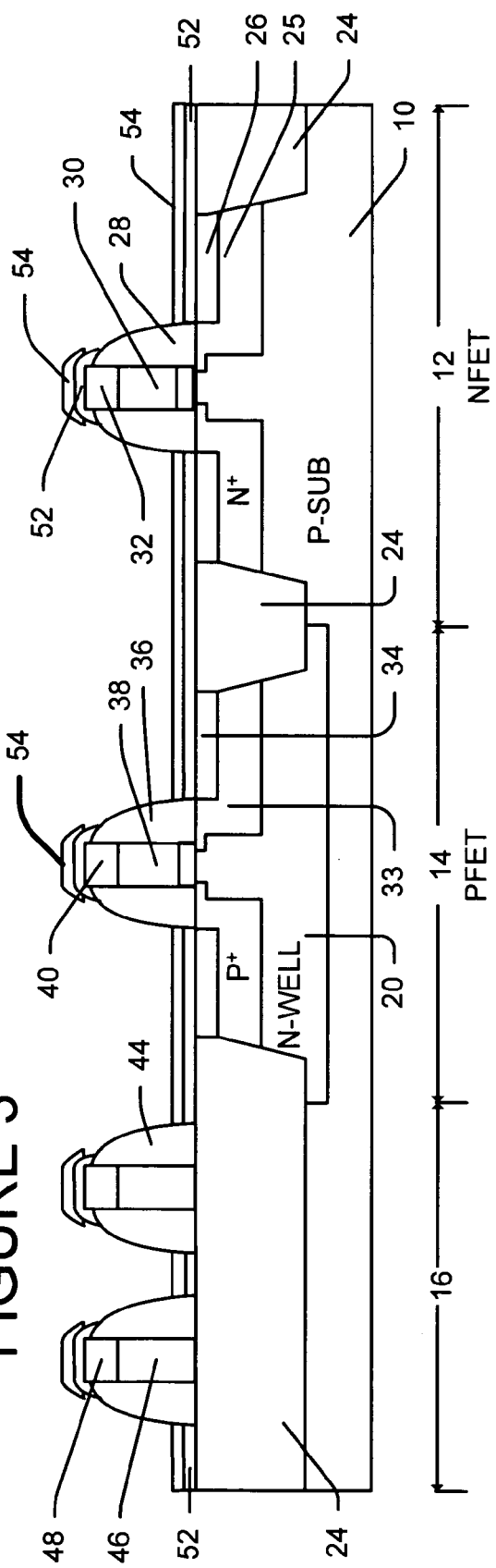
FIGURE 3
FIGURE 4

SPACER-LESS LOW-K DIELECTRIC PROCESSES

BACKGROUND OF INVENTION

1) Field of the Invention

This invention relates generally to the fabrication of semiconductor devices and more particularly to the fabrication of a MOS transistor without spacers and using low k materials.

2) Description of the Prior Art

Fabrication of semiconductor devices, such as metal oxide semiconductor field effect transistors (MOSFET) and complementary metal oxide semiconductor (CMOS) integrated circuits, involves numerous processing steps. Each step may potentially have an adverse effect on one or more device components.

In a typical MOSFET, a source and a drain are formed in an active region of a semiconductor layer by implanting N-type or P-type impurities in a layer of semiconductor material. Disposed between the source and drain is a body region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on a insulating layer that is, in turn, disposed on a silicon substrate).

A pervasive trend in modern integrated circuit manufacture is to produce transistors, and the structural features thereof, that are as small as possible. A factor in device performance is the capacitance of the elements of the circuit. Techniques are need to reduce capacitance.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,613,637: Composite spacer scheme with low overlapped parasitic capacitance—Formation of composite spacer in semiconductor device, e.g. metal oxide semiconductor field effect transistor device, by depositing low dielectric constant spacer layer on first spacer layer, and anisotropically etching the combined layers—Inventor: Lee, et al.

US20040171201A1: Low K-gate spacers by fluorine implantation—Fabrication of metal oxide semiconductor field effect transistor device involves performing fluorine implant through silicon nitride etch stop layer and into oxide gate sidewall spacers to form fluorine doped oxide gate sidewall spacers—Inventor: Gambino, Jeffrey P.

U.S. Pat. No. 6,724,051: Nickel silicide process using non-reactive spacer—Inventor: Woo, et al.

U.S. Pat. No. 6,107,667: MOS transistor with low-k spacer to suppress capacitive coupling between gate and source/drain extensions—Fabrication of an ultra large scale integration metal oxide semiconductor field effect transistor, involves providing a low-k spacer to suppress capacitive coupling between gate and source/drain extensions Inventor: An, et al.

US20040262692A1: Nonplanar device with stress incorporation layer and method of fabrication—Inventor: Hareland, et al.

U.S. Pat. No. 6,825,529 Stress inducing spacers—Spacer structure for semiconductor devices formed in substrate, has two spacer structures, each comprising stress inducing material adjacent to both sidewall of one of device's gate terminal and its channel which applies mechanical stress—Inventor: Chidambarrao

SUMMARY OF THE INVENTION

The example embodiments of the present invention provide structures and methods of manufacturing a CMOS transistor which is characterized as follows.

A first example embodiment comprises some of the following steps. We provide a gate dielectric and a gate over a substrate. We form first spacers on the gate sidewalls. We form a first dielectric layer over the substrate. We form a non-conformal dielectric layer over the first dielectric layer. We then remove a first thickness of the non-conformal dielectric layer to expose the first dielectric layer over the first spacers. We remove the first dielectric layer over the first spacers. We remove the first spacers. We form a contact etch stop layer over the substrate surface. We form a low K dielectric layer over the substrate surface. We form interconnects to the source/drain regions adjacent to the gate.

A second example embodiment comprises some of the following steps. We provide a gate dielectric and a gate over a substrate. We form first spacers on the gate sidewalls. We form a first dielectric layer over the substrate. We form a non-conformal dielectric layer over the first dielectric layer. We then remove a first thickness of the non-conformal dielectric layer to expose the first dielectric layer over the first spacers. We remove the first dielectric layer over the first spacers. We remove the first spacers. We form low K spacers on the gate. We form a second etch stop layer over the substrate surface. We form an ILD layer over the second etch stop layer. We form interconnects to the source/drain regions.

The invention also comprises example embodiments of devices of the method example embodiments at all stages.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 5 and 6A and 7A are cross sectional views for illustrating a first example method of the invention for forming a semiconductor device.

FIGS. 1 through 5 and 6B, 7B and 8 are cross sectional views for illustrating a second example method of the invention for forming a semiconductor device.

DETAILED DESCRIPTION OF THE EXAMPLE EMBODIMENTS

I. First Example Embodiment

The example embodiments of the present invention will be described in detail with reference to the accompanying drawings. The first example embodiment provides a method of removing spacer from gates and incorporating a low-k material in the ILD layer to increase device performance. An example of an device whose performance is increased is the ring oscillator. Preferably, the source drain regions have a silicide contact layer thereover. An aspect of the embodiment removes spaces from a gate and forms a low K ILD layer near the gate. The first example embodiment also includes device/structure embodiments.

A. Substrate Having a NFET Region, a PFET Region and a Peripheral Region

Figure 1:
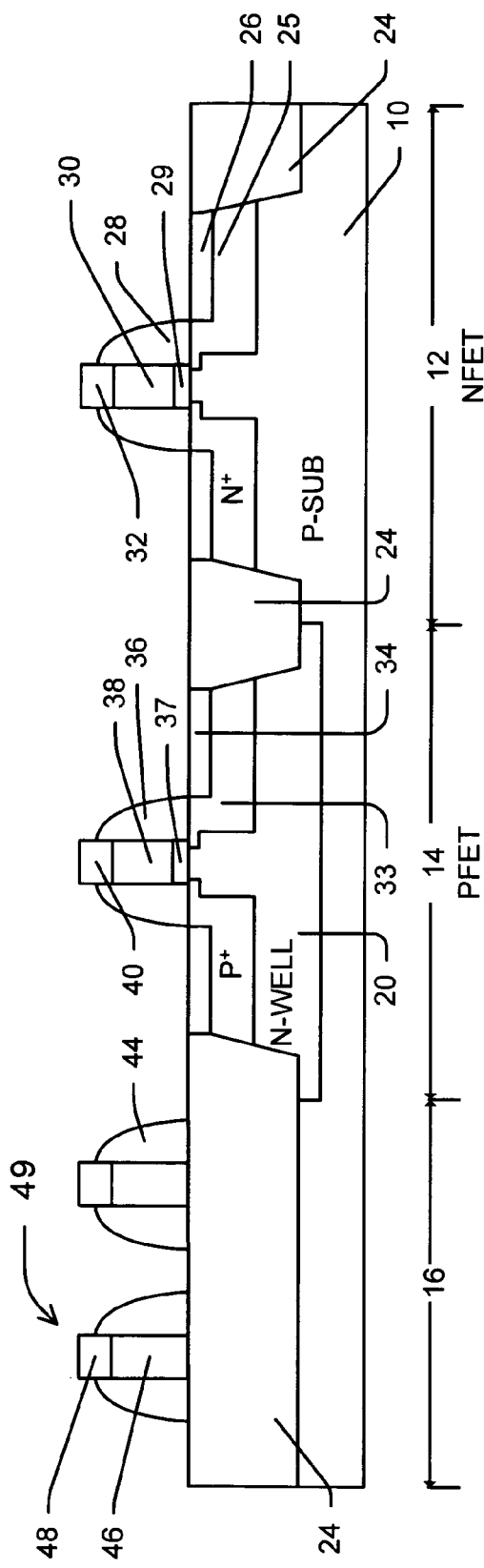

As shown in FIG. 1, we provide a substrate 10 having a NFET region 12, a PFET region 14 and a peripheral region 16. The substrate can have isolation region(s) 24 at least between the NFET region 12, the PFET region 14 and the peripheral region 16. FIG. 1 shows isolation regions 24 also between the PFET and NFET regions.

In the NFET region, we provide a NFET gate dielectric 29, NFET gate 30, NFET cap 32 (e.g., silicide), a NFET spacers on the NFET gate 30 sidewalls; NFET source/drain regions 25 in the NFET region adjacent to the NFET spacers 26. The spacers can be comprised of one or more layer or different materials.

We provide NFET S/D silicide regions 26 over the NFET source/drain regions 25 and the NFET cap 32 preferably comprised of silicide.

In the PFET region 14, we provide a PFET gate dielectric 37, PFET gate 38, PFET cap 40, and PFET spacers 36 on the PFET gate 38 sidewalls. We provide PFET source/drain regions 33 in the PFET region 14 adjacent to the PFET spacers 36. PFET S/D silicide regions 34 are formed over the PFET source/drain regions 33. The PFET cap 40 is preferably comprised of silicide.

The spacers can be comprised of one or more layer or different materials.

In the peripheral region 16, we provide peripheral gate structures 49 over the peripheral region 16. The peripheral gate structures are comprised of a peripheral gate 40, peripheral spacer 44 and peripheral cap 48. The peripheral gate structures are examples of routing poly gate. In this case, the gate-gate pitch is tighter hence the potential capacitance reduction from changing the nitride to a low-k spacer may be greater. The interconnecting poly can have a high poly-poly intra-capacitance that can potentially adversely affect circuit performance. The gates in the peripheral region can be part of the ring oscillator device.

The substrate has an (peripheral) isolation region 24 over at least a portion of the peripheral region 16, and the peripheral gate structure 49 is over the isolation region.

The structures can be made using a salicide process.

B. Form a First Dielectric Layer

Figure 2:
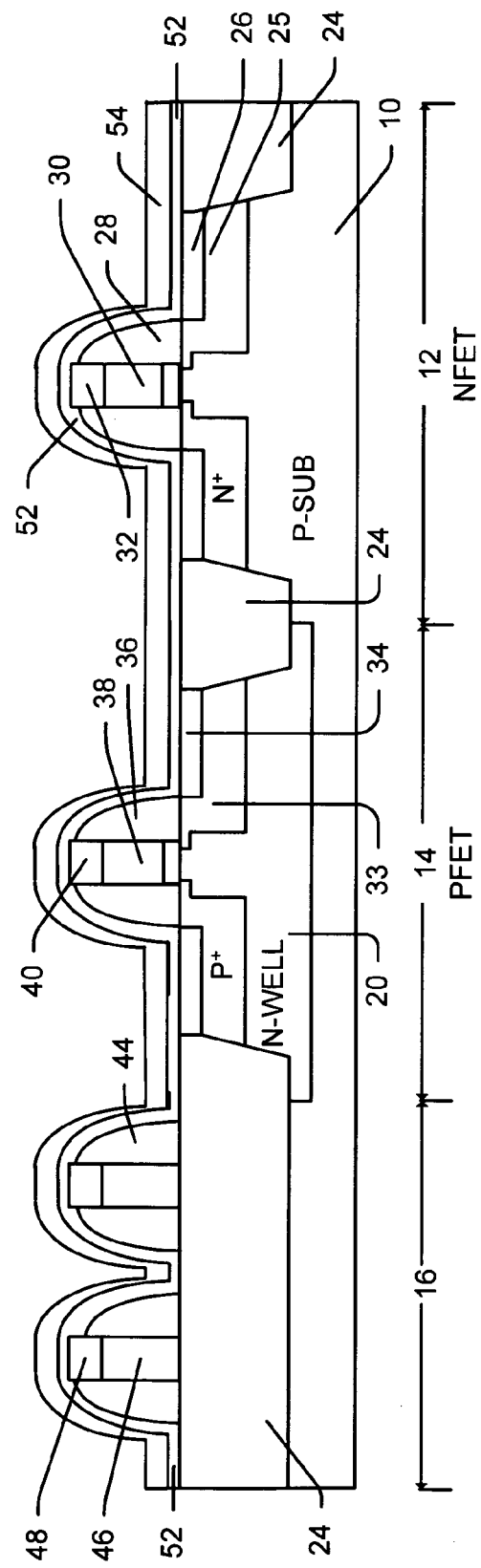

Referring to FIG. 2, we form a first dielectric layer 52 over the substrate 10 at least the NFET region 12, the PFET region 14 and the peripheral region 16. The first dielectric layer is preferably conformal so that the first dielectric layer has about the same thickness over vertical and horizontal surfaces.

The first dielectric layer 52 can be comprised of oxide, undoped oxide or a doped oxide; and preferably of undoped oxide; and can have a thickness between 50 and 100 angstroms.

C. Non-Conformal Dielectric Layer

We then form a non-conformal dielectric layer 54 over the conformal dielectric layer 52. The non-conformal dielectric layer 54 preferably has a etch selectivity to the conformal dielectric layer. The etch selectivity can be greater than 2:1.

The non-conformal dielectric layer can be comprised of nitride, SiON or SiC; and preferably of PECVD nitride or a HDP nitride.

The non-conformal dielectric layer 54 is thicker over the PFET cap 40 and NFET cap 32 and the substrate (such as a thickness between 200 and 600 A (angstroms)) than over the PFET and NFET spacers 36 28 sidewalls (for example a thickness between 50 and 150 A (angstroms)). Preferably the ratio between the non-conformal layer 54 thickness above the FETs & substrate to the thickness over the spacers/sidewalls is at least about 2:1 (e.g., between 1.5:1 and 5:1) and most preferably greater than 4:1.

The non-conformal dielectric layer 54 can be thicker over approximately horizontal surfaces than over sloped or vertical surfaces.

In a non-uniform (non-conformal) deposition process, the deposition is more directional (top down deposits faster than horizontal).

D. Remove a First Thickness of the Non-Conformal Dielectric Layer in the NFET Region to Expose the Conformal Dielectric Layer Over the Spacers As shown in FIG. 3, we remove a first thickness (e.g., portion) of the non-conformal nitride layer 54 in the NFET region 12, preferably using an anisotropic etch, to expose the conformal dielectric layer 52 over the spacers 28 36 44.

The first thickness is between about 33 and 66% of the maximum thickness of the non-conformal layer 54.

E. Remove the Conformal Dielectric Layer Over the PFET Spacers, NFET Spacers and Peripheral Spacers As shown in FIG. 4, we also remove the conformal dielectric layer 52 over the PFET spacers 36, NFET spacers 28 and peripheral spacers 54. The conformal dielectric layer 52 can be removed with a selective etch to the underlying layers. The remaining non-conformal layer 54 is used as an etch mask.

F. Remove the Spacers

Figure 5:
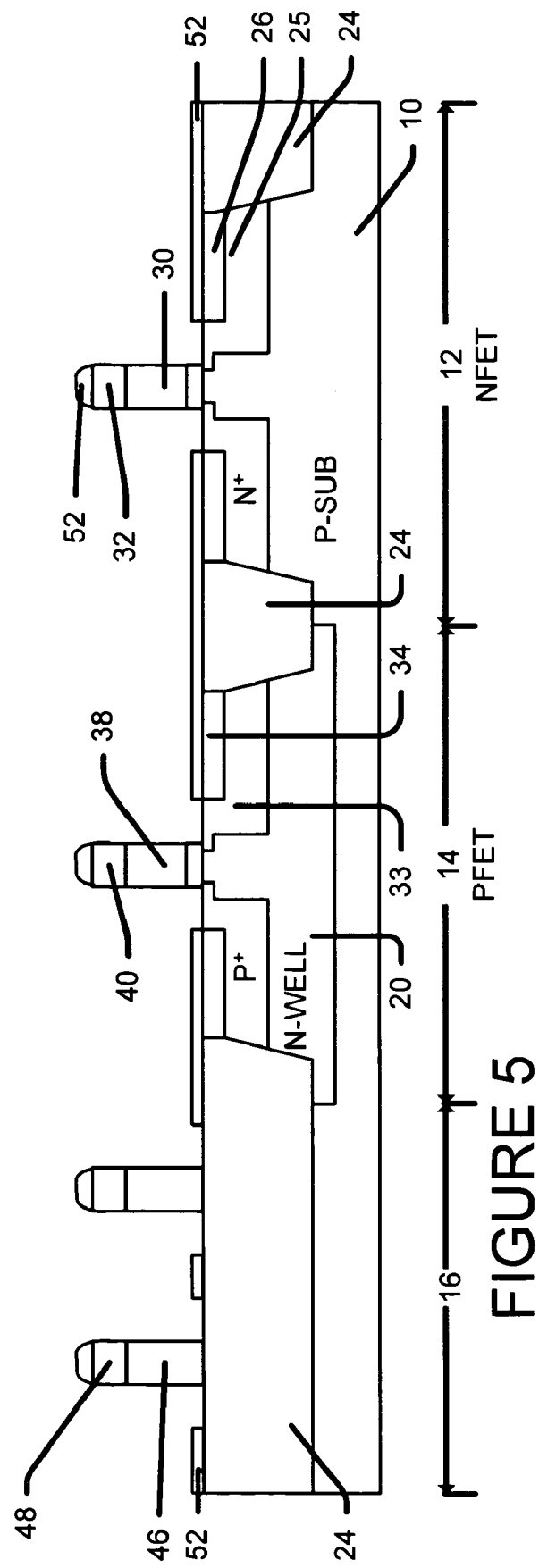

Referring to FIG. 5, we remove the remove the PFET spacers 36, NFET spacers 28 and peripheral spacers 54. The spacers can be removed using a selective isotropic etch, such as hot phosphoric acid or HF/EG (Ethylene Gycol). The remaining dielectric layer 52 is used as an etch mask. The silicide regions are protected from the spacer etch by the overlying first dielectric layer 52.

G. Form a Contact Etch Stop Layer

Figure 6A:
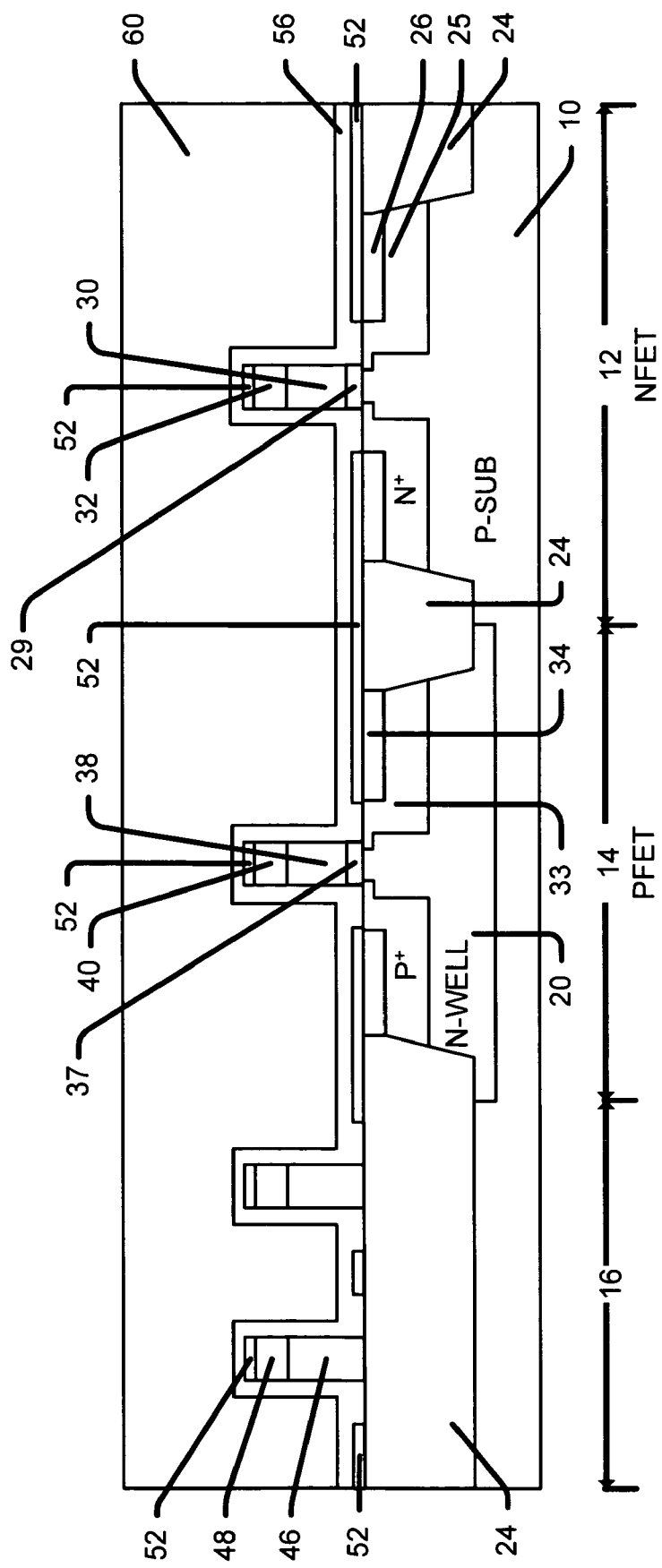

Referring to FIG. 6A, we can form a contact etch stop layer 56 over the substrate surface.

The contact etch stop layer 56 can be comprised of SiN, SiC, or SiON and is preferably comprised of SiN; and can have a thickness about between 100 and 1000 (A) Angstroms.

H. Form a Low K Dielectric Layer Over the Substrate Surface

Still referring to FIG. 6A, we form a low k dielectric layer 60 over the substrate surface. The low k dielectric layer can have a dielectric constant (k) between 3.7 and 1.0; and preferably a K less than 3.0.

The low K dielectric layer 60 can be comprised of fluorine-doped silicare glass (e.g., FSG, k=3.2), carbon doped CVD oxides (e.g., k=2.7), inorganic spin on films such as hydrogen silsesquioxane (e.g., HSQ, k=2.9) and methylsilsesquioxane (e.g., MSQ, k=2.6) and organic spin-on films (such as SiLK (k=2.65)) or porous methylsilsesquioxane(e.g., porous SiLK (k=1.5).

I. Complete the Devices

Figure 7A:
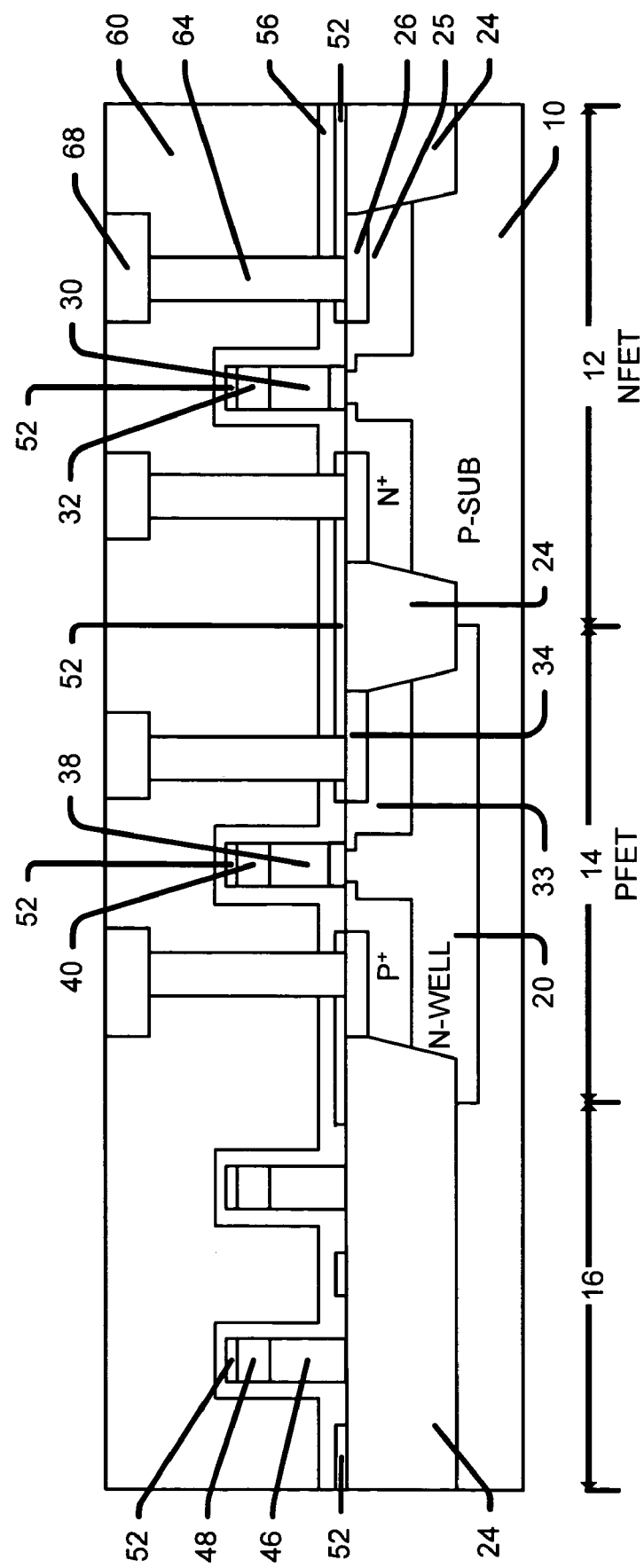

Referring to FIG. 7A, we form contacts/interconnects 68 64 to the NFET and PFET source/drain regions 25 33 and to the gates (not shown).

The devices can be completed using convention processes.

Non-Limiting Example Benefits of the Some Features of the First Embodiment

The first example embodiment provides a method of removing spacers from gates (e.g, poly rings) and incorporating a low-k material ILD layer to increase device performance. An example of an device whose performance is increased is the ring oscillator. The gates in the peripheral region can be part of the ring oscillator. The ring oscillator performance can be increased because delay is a function of R (resistance)*C (capacitance). Hence, the lower the parasitic capacitance, the lower the delay, which translates to faster speed. Preferably, the source drain regions have a silicide contact layer thereover. The silicide contact layer can serve as an etch stop to prevent the contact etch from gouging into the silicide). The silicide regions reduce the resistance, thus can reducing delay). An embodiment removes spacers from the gate and forms a low K ILD layer near the gate.

II. Second Example Embodiment—Form Low-k Spacers

The second example embodiment of the invention incorporates low-k spacers by replacing the traditional spacers after silicidation serves to reduce the parasitic capacitances thereby improving ring oscillator performance. Also, by implementing the low-k spacers only after silicidation, the low-k spacers are not compromised by multiple high dose ion implantations and resist strip steps. The second example embodiment also includes device/structure embodiments.

The example process for the second embodiment is similar to the first embodiment from FIGS. 1 to 5. FIGS. 1 to 5 and 6B, 7B and 8 show an example of the second example embodiment.

A. Form a Low k Etch Stop Layer Over the Substrate Surface

Figure 6B:
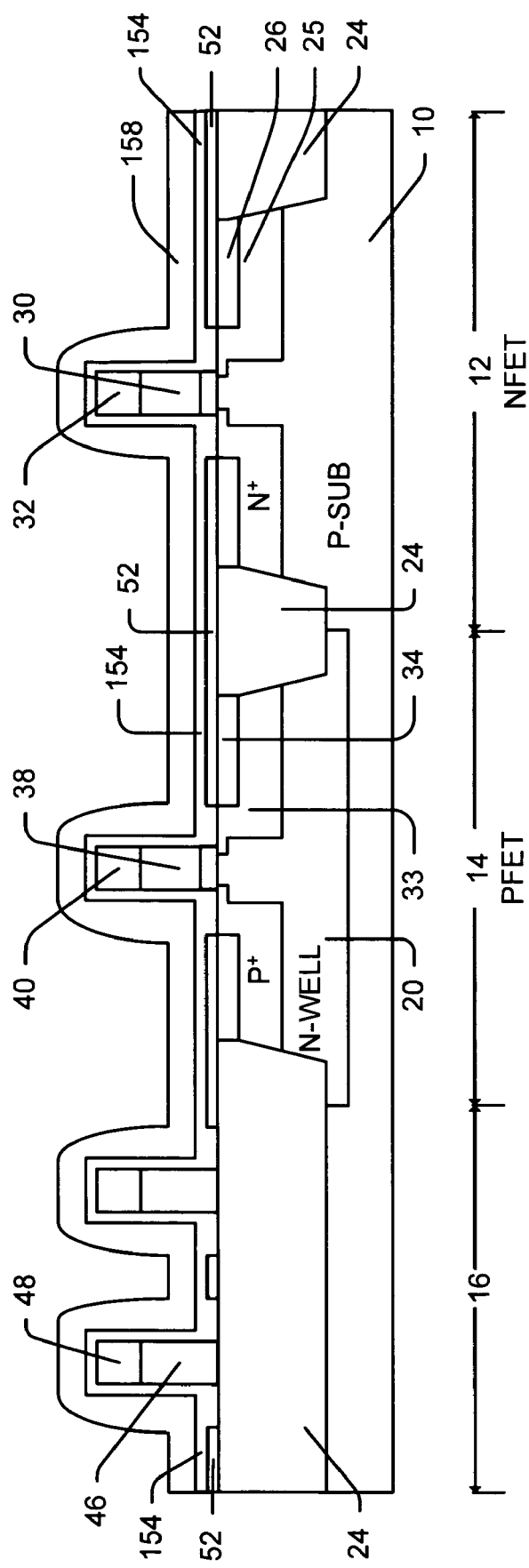

Referring to FIG. 6B, we form a low k etch stop layer 154 over the substrate surface.

The low k etch stop layer 154 can be comprised of SiC, carbon doped SiN or SiN and more preferably comprised of SiC; and can have a thickness between 50 and 300 angstroms.

B. Form a Low k Dielectric Layer

Next, we form a low k dielectric layer 158 over the substrate surface. The low k dielectric layer 158 can have a dielectric k between 3.7 and 1.0 and more preferably less than 3.0.

The low k dielectric layer 158 can be comprised of fluorine-doped silicate glass (e.g., FSG, k=3.2), carbon doped CVD oxides (e.g., k=2.7), inorganic spin on films such as hydrogen silsesquioxane (e.g., HSQ, k=2.9) and methylsilsesquioxane (e.g., MSQ, k=2.6) and organic spin-on films (such as SiLK (k=2.65)) and porous methylsilsesquioxane (e.g., SiLK (k=1.5); and can have a thickness between 300 and 1000 angstroms.

C. Form Low K Spacers on the NFET, PFET and Peripheral Gates

Figure 7B:
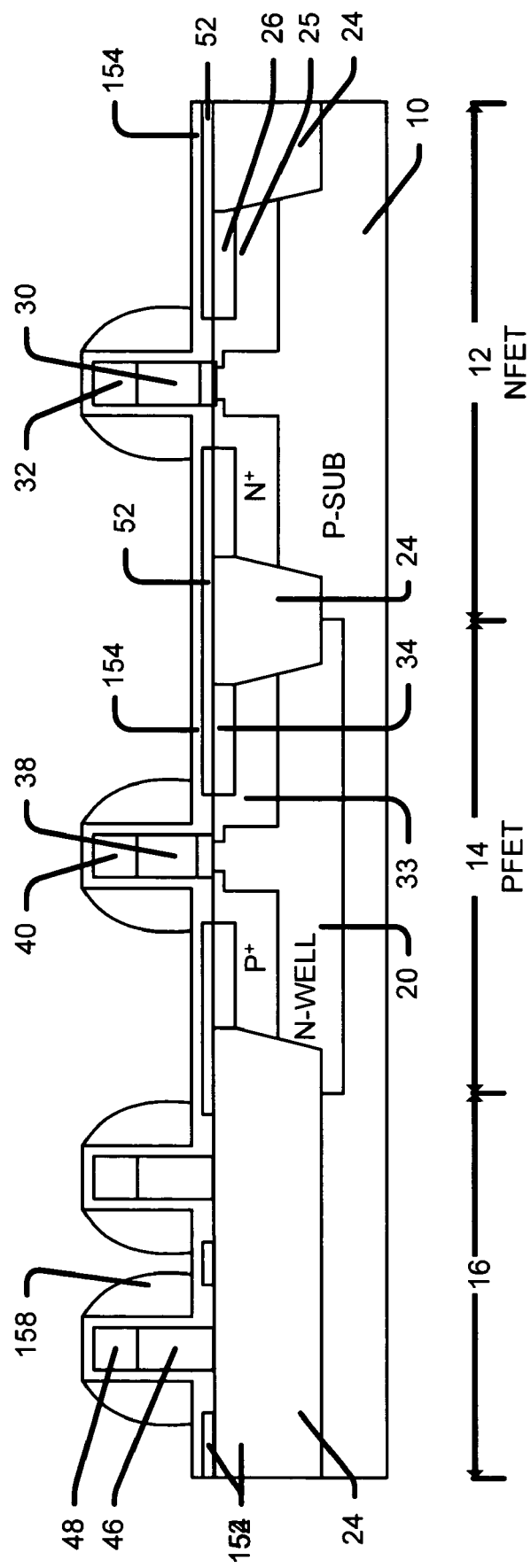

Referring to FIG. 7B, we anisotropically etch the low k dielectric layer to form low K spacers 158 on the NFET, PFET and peripheral gates 30 38 46.

The anisotropic etch stops on the low k etch stop layer 154 thereby protecting the silicide regions 26 36.

D. Form a Second Etch Stop Layer

Figure 8:
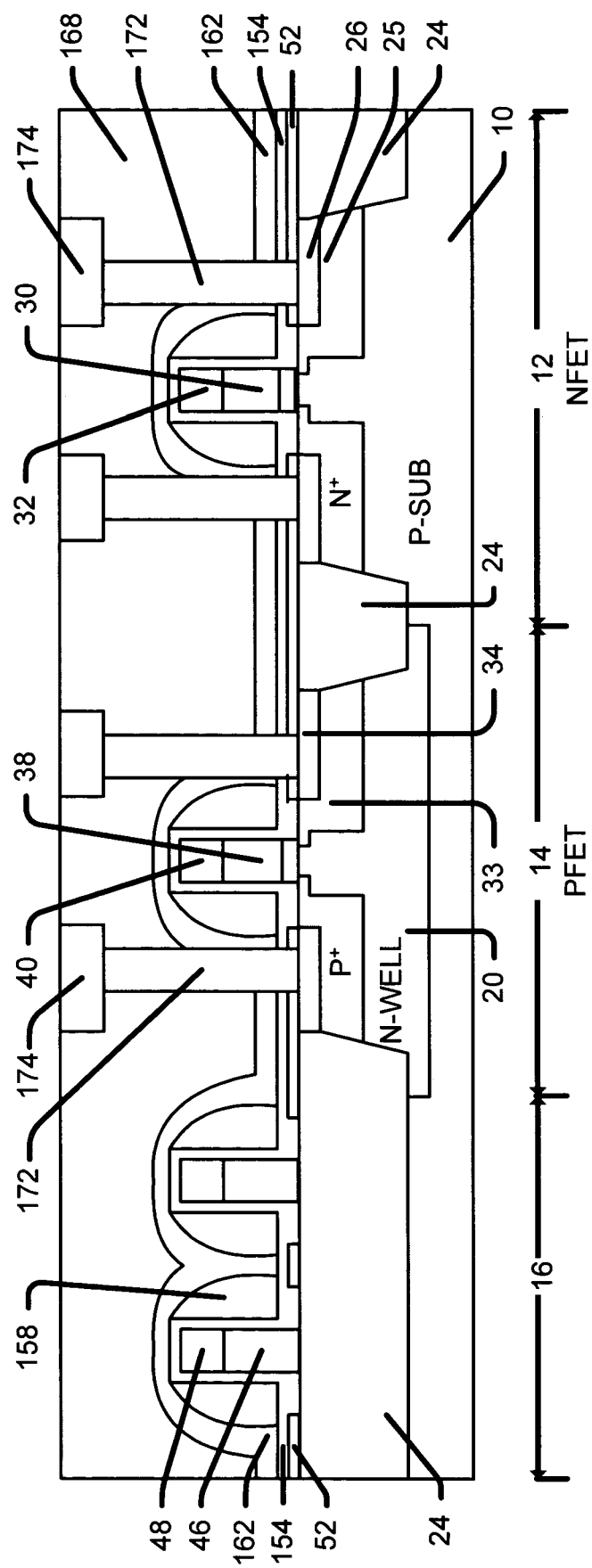

As shown in FIG. 8, we form a (optional) second etch stop layer 162 over the substrate surface.

The second etch stop layer 162 can be comprised of SiN, carbon doped SiN or SiC and is preferably comprised of SiN and can have a thickness between 200 and 800 angstroms. The second etch stop layer is preferably used as an etch stop for subsequent the contact via opening etch through the ILD layer.

E. Form IILD Layer

As shown in FIG. 8, we form an interlevel dielectric (ILD) layer 168 over the substrate surface. The ILD layer can be comprised of silicon dioxide, doped silicon dioxides and low-k dielectrics.

F. Form Contacts/interconnects

We form contact openings thru the ILD layer, contact etch stop layer, conformal dielectric layer 52A to expose the S/D silicide and gate silicide regions.

Next, we form contacts 172 and interconnects 174 to the NFET and PFET source/drain regions 25 33 and gates (not shown).

G. Some Non-limiting Benefits of the Second Example Embodiment

The second example embodiment of the invention incorporates low-k spacers by replacing the traditional spacers after silicidation serves to reduce the parasitic capacitances thereby improving ring oscillator performance. Traditional spacers with SiN have high k value which increases the parasitic capacitance and in turn increases the circuit delay (delay=R*C). Also, by implementing the embodiment's low-k spacers only after silicidation, the embodiment's low-k spacers are not compromised by multiple high dose ion implantations and resist strip steps which could reduce the effectiveness of the low-k material.

H. Non-Limiting Example Embodiments

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrange-

What is claimed is:

1. A method of fabricating a semiconductor device comprising:
providing a gate dielectric over a substrate;
providing a gate over said gate dielectric, said gate having gate sidewalls;
forming first spacers on the gate sidewalls;
forming a first dielectric layer over the substrate;
forming a non-conformal dielectric layer over said first dielectric layer;
removing a first thickness of the non-conformal dielectric layer to expose the first dielectric layer over the first spacers;
removing portions of the first dielectric layer over the first spacers; and
removing the first spacers.

2. The method of claim 1 which further comprises:
forming a contact etch stop layer over the substrate surface;
forming a low K dielectric layer over the substrate surface; and
forming interconnects to source and drain regions adjacent to said gate.

3. The method of claim 1 which further comprises:
providing source/drain regions in said substrate adjacent to said first spacers; and
providing source/drain silicide regions over said source/drain regions.

4. The method of claim 1 wherein the first thickness is between about 33 and 66% of the maximum thickness of said non-conformal dielectric layer.

5. The method of claim 1, which after the step of removing the first spacers, further comprises:
forming a first etch stop layer on the substrate;
forming low K spacers on sidewalls of said gate on the first etch stop layer;
forming a second etch stop layer over the substrate surface;
forming an ILD layer over said second etch stop layer; and
forming interconnects to said source/drain regions adjacent to the gate.

6. The method of claim 1 which further comprises:
forming a first etch stop layer comprising a low k dielectric material over the substrate surface;
forming a low k dielectric layer over the low k first etch stop layer;
anisotropically etching said low k dielectric layer to form low K spacers on sidewalls of said gate on the first etch stop layer, wherein the anisotropic etch stops on said first etch stop layer;
forming a second etch stop layer over the substrate surface;
forming an ILD layer over said second etch stop layer; and
forming interconnects to source/drain regions adjacent to the gate.

7. The method of claim 1 which further includes performing steps to form a ring oscillator device.

8. A method of fabricating a semiconductor device comprising:
providing a substrate having a device FET region and a peripheral region;
providing a FET in the FET region, wherein the FET comprises a FET gate, FET spacers on the FET gate sidewalls, FET source/drain regions in said FET region adjacent to said FET spacers, and FET S/D suicide regions over said FET source/drain regions;
providing peripheral gate structures over said peripheral region, wherein said peripheral gate structures are comprised of a peripheral gate, peripheral spacers;
forming a conformal dielectric layer over the substrate in at least the FET region and the peripheral region;
forming a non-conformal dielectric layer over said conformal dielectric layer;
removing a first thickness of the non-conformal dielectric layer in the FET region; using an anisotropic etch, to expose the conformal dielectric layer over the FET spacers;
removing the conformal dielectric layer over the FET spacers, and the peripheral spacers; and
removing the FET spacers and peripheral spacers.

9. The method of claim 8 which further comprises:
forming a contact etch stop layer over the substrate surface;
forming a low K dielectric layer over the substrate surface; and
forming interconnects to said FET source/drain regions.

10. The method of claim 8 which further comprises:
forming a first etch stop layer comprising a low k dielectric material over the substrate surface;
forming a low k dielectric layer over the low k first etch stop layer;
anisotropically etching said low k dielectric layer to form low K spacers on the FET gate and peripheral gate, wherein the anisotropic etch stops on said low k first etch stop layer thereby protecting the S/D silicide regions;
forming a second etch stop layer over the substrate surface;
forming an ILD layer over second etch stop layer; and
forming interconnects to said FET source/drain regions.

11. The method of claim 8 wherein:
said substrate has an isolation region over at least a portion of said peripheral region; and
said peripheral gate structure is over said isolation region.

12. The method of claim 8 wherein said non-conformal dielectric layer is thicker over about horizontal surfaces than over sloped or vertical surfaces.

13. The method of claim 8 wherein the first thickness is between about 33 and 66% of the maximum thickness of said non-conformal dielectric layer.

14. The method of claim 8 which further includes performing steps to form a ring oscillator device.

15. A method of forming a device comprising:
providing a substrate prepared with a gate of a transistor with first spacers on sidewalls of the gate, wherein the substrate comprises a topography with horizontal portions corresponding to the substrate and a top of the gate and non-horizontal portions corresponding to sidewalls of the gate;
forming a non-conformal dielectric layer over the substrate and the gate with the first spacers the non-conformal dielectric layer having a horizontal thickness in the horizontal portions which is greater than a non-horizontal thickness in the non-horizontal portions;
removing a first thickness of the non-conformal dielectric layer to remove non-horizontal portions while leaving a remaining thickness of the non-conformal dielectric layer in the horizontal portions; and
removing the first spacers, wherein removing the non-horizontal portions of the non-conformal dielectric layer facilitates removal of the first spacers.

16. The method of claim 15 comprises:
forming a dielectric layer on the substrate and gate with first spacers prior to forming the non-conformal dielectric layer, wherein removing non-horizontal portions of the non-conformal dielectric layer exposes the dielectric layer over the first spacers; and removing exposed portions of the dielectric layer to remove the first spacers.

17. The method of claim 16 comprises:

removing remaining portions of the non-conformal dielectric layer and dielectric layer after removing the first spacers;

forming a first etch stop layer on the substrate and the gate; and forming second spacers on the first etch stop layer on sidewalls of the gate.

18. The method of claim 17 comprises:

forming a second etch stop layer over the first etch stop layer and second spacers;

forming an interlevel dielectric layer on the substrate over the second etch stop layer; and forming interconnections in the interlevel dielectric layer to source/drain regions adjacent to the gate.

19. The method of claim 17 comprises:

forming an interlevel dielectric layer on the substrate over the first etch stop layer and second spacers; and forming interconnections in the interlevel dielectric layer to source/drain regions adjacent to the gate.

20. The method of claim 15 which further includes processing to form a ring oscillator.

* * * * *